US006750529B2

United States Patent
Mori

(10) Patent No.: US 6,750,529 B2
(45) Date of Patent: Jun. 15, 2004

(54) SEMICONDUCTOR DEVICES INCLUDING FUSES AND MULTIPLE INSULATION LAYERS

(75) Inventor: Katsumi Mori, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/202,044

(22) Filed: Jul. 25, 2002

(65) Prior Publication Data
US 2003/0052385 A1 Mar. 20, 2003

(30) Foreign Application Priority Data
Jul. 25, 2001 (JP) ........................................ 2001-224689

(51) Int. Cl.$^7$ .............................................. H01L 29/00
(52) U.S. Cl. ........................ 257/529; 257/701; 257/528; 257/758; 257/760
(58) Field of Search .................................. 257/529, 701, 257/528, 530, 750, 760, 758, 635

(56) References Cited

U.S. PATENT DOCUMENTS

| 6,320,243 | B1 | * | 11/2001 | Jeong et al. ................. | 257/529 |
|---|---|---|---|---|---|
| 8,366,503 | | | 4/2002 | Sonada | |
| 6,413,848 | B1 | | 7/2002 | Giust et al. | |
| 6,433,406 | B1 | * | 8/2002 | Kagiwata ..................... | 257/529 |
| 6,509,624 | B1 | | 1/2003 | Radens et al. | |
| 2002/0125576 | A1 | * | 9/2002 | Koyama et al. ............ | 257/758 |
| 2003/0038304 | A1 | | 2/2003 | Mori | |
| 2003/0038339 | A1 | | 2/2003 | Mori | |

FOREIGN PATENT DOCUMENTS

| JP | 09-172087 | 6/1997 |
|---|---|---|
| JP | 11-087521 | 3/1999 |
| JP | 11-260922 | 9/1999 |
| JP | 2000-243845 | 9/2000 |
| JP | 2000-268699 | 9/2000 |

OTHER PUBLICATIONS

Notice of Reasons of Rejection for Japanese Patent Application No. 2001–224669 (from which priority is claimed for 10/202,044) dated Jun. 10, 2003 (which lists 09–172087 cited above).
Notice of Reasons of Rejection for Japanese Patent Application No. 2001–224690 (from which priority is claimed for 10/202,063) dated Jun. 10, 2003(which lists 11–260922 and 2000–243845 cited above).
Notice of Reasons of Rejection for Japanese Patent Application No. 2001–224688 (from which priority is claimed for 10/202,028) dated Jun. 10, 2003 (which lists 2000–268699 and 11–087521 cited above).

* cited by examiner

Primary Examiner—Nathan J. Flynn
Assistant Examiner—Pershelle Greene
(74) Attorney, Agent, or Firm—Konrad Raynes & Victor, LLP; Alan S. Raynes

(57) ABSTRACT

A semiconductor device may include a fuse section 110 in which a plurality of fuses 20 to be fused by irradiation of a laser beam are formed. The fuses 20 are arranged at a specified pitch. A first insulation layer 33 is embedded between adjacent ones of the fuses 20. A second insulation layer 39 is formed on the first insulation layer 33. The first insulation layer 33 and the second insulation layer 39 are formed such that their interface 42 is generally at the same level as the top surface of the fuses 20. As a result, the fuses may be reliably fused without generating cracks in the interface 42 at the time of fusing the fuses.

24 Claims, 5 Drawing Sheets

SEMICONDUCTOR DEVICES INCLUDING FUSES AND MULTIPLE INSULATION LAYERS

Applicant claims priority in and hereby incorporates by reference Japanese Application No. 2001-224689, filed Jul. 25, 2001, in its entirety. Applicant hereby incorporates by reference U.S. application Ser. No. 10/202,063, filed Jul. 25, 2002, in its entirety. Applicant hereby incorporates by reference U.S. application Ser. No. 10/202,028, filed Jul. 25, 2002, in its entirety.

TECHNICAL FIELD

The present invention relates to semiconductor devices including fuses, and includes semiconductor devices including fuses that may be fused by irradiation of a laser beam.

RELATED ART

Currently, replacement circuits are built in semiconductor devices in order to substitute for circuits that might become defective due to deficiencies that could occur during the manufacturing process. For example, in the case of a semiconductor memory device, since many of the deficiencies that occur during the manufacturing process would occur in its memory section, multiple redundant memory cells in units of word lines or bit lines are generally disposed therein. A redundant circuit controls the redundant memory cells. When a deficient element is generated in one chip that forms a semiconductor device, the redundant circuit provides a function to switch the deficient element to a normal element by irradiating a laser beam to a fuse element having an address corresponding to the deficient element to thereby fuse (break) the fuse element.

Due to demands in recent years in higher integration of semiconductor devices, memories have been further miniaturized. In connection with this trend, fuse elements themselves have also been miniaturized. Reliability of the fuse elements affects the production yield of semiconductor memory devices, and therefore highly reliable fusing of fuse elements is desired. Improvements in the reliability in fusing fuse elements can improve the production yield of semiconductor devices.

SUMMARY

Certain embodiments relate to a semiconductor device including a plurality of fuses arranged at a specified pitch, wherein the fuses are adapted to be fused by irradiation of a laser beam. The device also includes a first insulation layer embedded between adjacent ones of the fuses, and a second insulation layer formed on the first insulation layer. A top surface of the fuses and an interface between the first insulation layer and the second insulation layer are generally at an identical level.

Certain embodiments also relate to a semiconductor device including a plurality of fuses spaced apart from one another, the fuses including an upper layer thereon. The device also includes a first insulation layer located between adjacent fuses, and a second insulation layer formed on the first insulation layer. A top surface of the upper layer on the fuses and an interface between the first insulation layer and the second insulation layer are at an identical level.

Certain embodiments also relate to a semiconductor device including a plurality of fuses, wherein the fuses are adapted to be fused by irradiation of a laser beam. The device also includes a first insulation layer disposed between adjacent ones of the fuses, a second insulation layer formed on the first insulation layer, and a dielectric layer disposed under the fuses. An interface between the first insulation layer and the second insulation layer is positioned so that when at least one of the fuses is being fused by irradiation of the laser beam, cracks are formed at a level above that of the at least one of the fuses prior to any cracks being formed in the dielectric layer below the at least one of the fuses.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
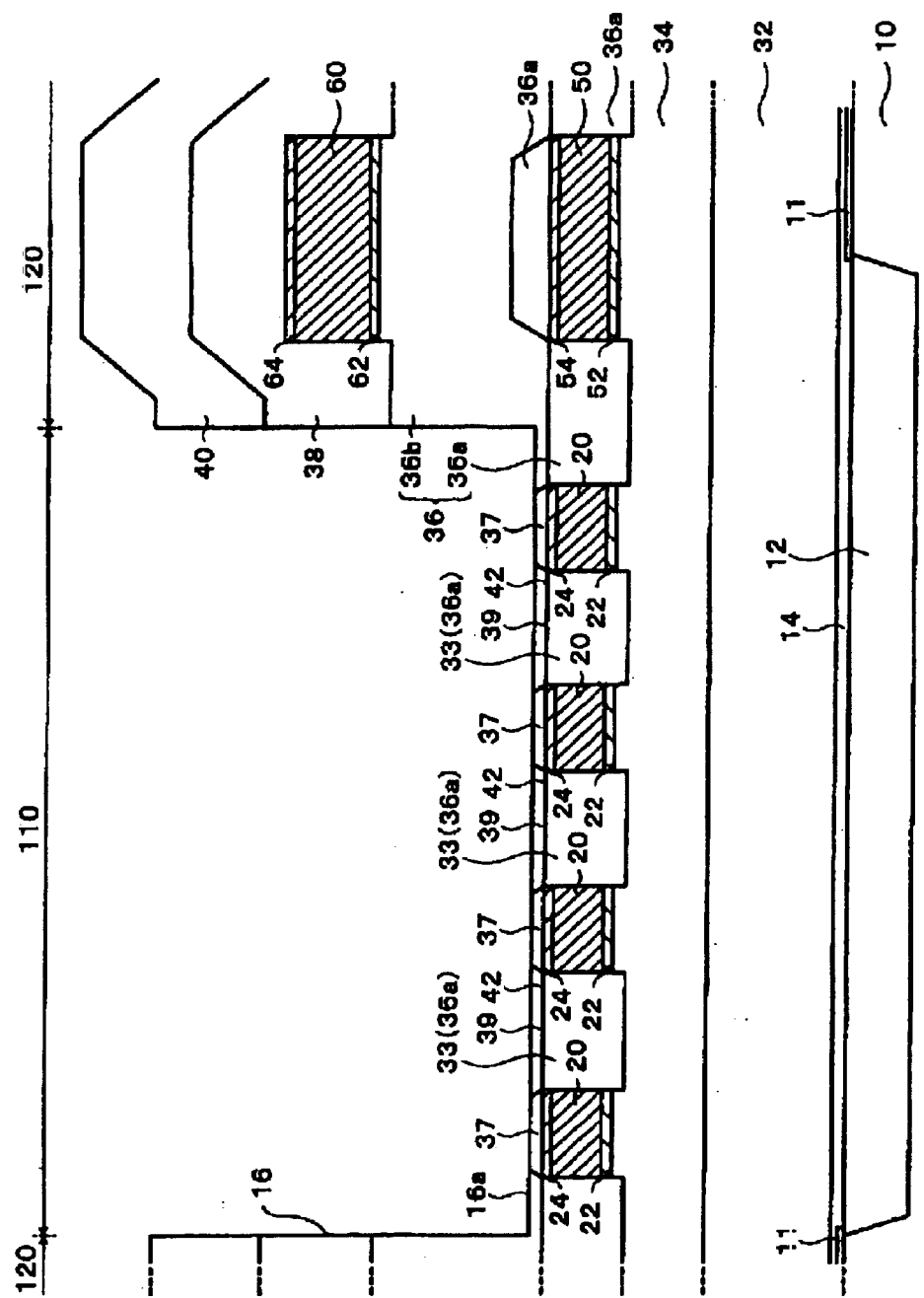
FIG. 1 schematically shows a cross-sectional view of a semiconductor device in accordance with one embodiment of the present invention.

A semiconductor device in accordance with certain embodiments of the present invention is characterized in comprising:
- a plurality of fuses arranged at a specified pitch wherein the fuses are to be fused by irradiation of a laser beam;
- a first insulation layer embedded between adjacent ones of the fuses; and
- a second insulation layer formed on the first insulation layer,
- wherein a top surface of the fuses and an interface between the first insulation layer and the second insulation layer are generally at an identical level.

In accordance with certain embodiments of the present invention, the fuses can be appropriately fused without generating cracks in an insulation layer that is located below the fuses. As a result, the production yield can be improved.

The following semiconductor devices in accordance with certain preferred embodiments of the present invention indicated in sections (1)–(6) below may be listed as examples.

(1) The first insulation layer and the second insulation layer may preferably be formed by different processes. According to this embodiment, an interface between the first insulation layer and the second insulation layer may be formed without regard to the types of materials used in the first and second insulation layers.

(2) The second insulation layer may preferably have a hardness lower than the hardness of the first insulation layer. According to this embodiment, when the material comprising the fuses vaporizes at the time of blowing the fuses, cracks are generated in the second insulation layer with a lower hardness, which makes it easier to locally remove the second insulation layer together with the vaporization of the material.

In this case, the first insulation layer may preferably be formed from FSG (fluorinated silicate glass), and the second insulation layer may preferably be formed from silicon oxide.

(3) A third insulation layer may be formed on the fuses. In this case, the third insulation layer may be formed by the same process that forms the first insulation layer.

(4) The third insulation layer may preferably have a film thickness between 0.2 μm and 1 μm. According to this embodiment, because the film thickness of the insulation layer that is formed on the fuses is 0.2 to 1 μm, the fuse can be accurately fused by irradiation of a laser beam without harming the reliability of the semiconductor device.

(5) The fuses may be formed at a bottom section of an opening section formed on a semiconductor substrate.

(6) Furthermore, the semiconductor device may further include a circuit section having a structure of multiple wiring layers, and the fuses are formed in a layer at a level identical with that of one of the wiring layers of the circuit section.

In this case, a film thickness of the fuses may preferably be generally equal to a film thickness of one of the wiring layers that compose the circuit section.

A preferred embodiment of the present invention will be described with reference to the accompanying drawings.

Figure 2:
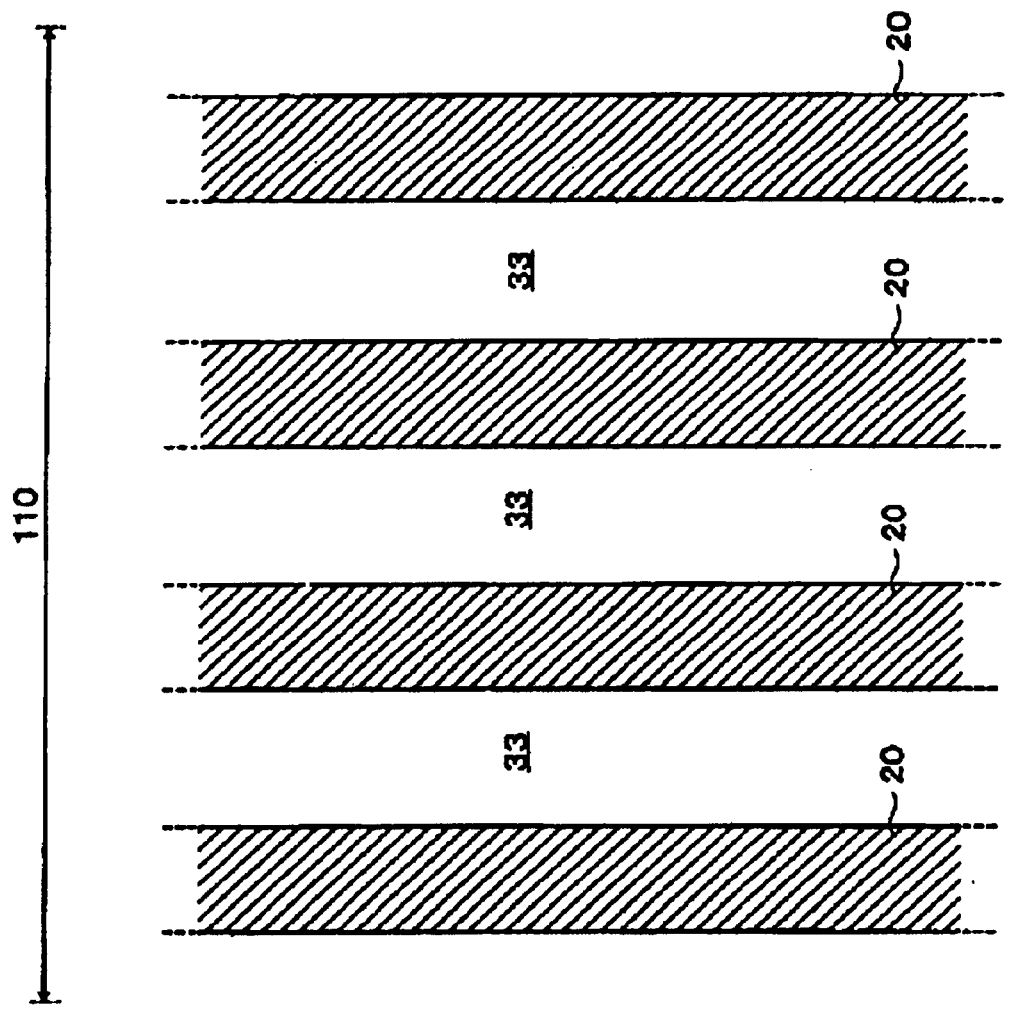
FIG. 2 schematically shows a plan view of fuses formed in the semiconductor device shown in FIG. 1.

FIG. 1 schematically shows a cross-sectional view of a semiconductor device in accordance with an embodiment of the present invention. FIG. 1 shows a cross section where fuses 20 are cut in a plane perpendicular to a longitudinal direction of the fuses 20. FIG. 2 schematically shows a plan view of the fuses 20 formed in the semiconductor device shown in FIG. 1.

The semiconductor device in accordance with the present embodiment has, as shown in FIG. 1, a circuit section 120 having a structure with multiple wiring layers, and a fuse section 110 including a plurality of fuses 20 that may be fused by irradiation of laser light. It is noted that FIG. 1 shows a structure of the fuses 20 before being fused.

The circuit section 120 and the fuse section 110 are both formed on a silicon substrate 10. It is noted that the substrate may not be limited to a silicon substrate but may be any substrate that includes a semiconductor region, including, for example, a GaAs substrate, a SiGe substrate, and a SOI substrate in which a thin film of silicon layer is formed on an insulation material. First-fourth interlayer dielectric layers 32, 34, 36 and 38 are deposited on the silicon substrate 10 in layers in this order from the side of the silicon substrate 10. The first-fourth interlayer dielectric layers 32, 34, 36 and 38 may preferably be formed from layers of silicon oxide or FSG or layers of these materials. Also, the third interlayer dielectric layer 36 is preferably formed from stacked layers of a lower insulation layer 36a and an upper insulation layer 36b.

Through holes may be formed in the first—fourth interlayer dielectric layers 32, 34, 36 and 38 at specified locations, respectively. Conductive material may be embedded in the through holes to thereby form contact sections. The contact sections electrically connect wiring layers formed above and below each of the interlayer dielectric layers. Furthermore, a passivation layer 40, which may be formed from, for example, a silicon nitride layer, is preferably formed on the fourth interlayer dielectric layer 38.

The circuit section 120 includes a circuit that includes elements such as transistors. A memory circuit, a liquid crystal driver circuit, and an analog circuit in which capacitors and resistor elements are formed, may also be examples of such a circuit. Also, the memory circuit may include, for example, a DRAM, an SRAM, a flash memory or the like.

In the circuit section 120, multiple wiring layers (FIG. 1 shows only wiring layers 50 and 60) are formed to electrically connect transistors composing memories and other elements which may be included in the circuit section 120. In the semiconductor device shown in FIG. 1, the wiring layer 50 is formed on the second interlayer dielectric layer 34, and the wiring layer 60 is formed on the third interlayer dielectric layer 36.

The fuse section 110 is defined by a region including an opening section 16 that is formed over the substrate 10, as shown in FIG. 1. The opening section 16 is formed by etching a specified region of the semiconductor device from the side of the passivation layer 40 to an intermediate section of the upper insulation layer 36b. Also, in the fuse section 110, the fuses 20 are formed in plurality at a bottom section 16a of the opening section 16 and arranged at a specified pitch.

The fuses 20 are formed on the second interlayer dielectric layer 34. A first insulation layer 33 is formed on the second interlayer dielectric layer 34. The first insulation layer 33 is embedded between adjacent ones of the fuses 20. Furthermore, a second insulation layer 39 is formed on the first insulation layer 33.

The first insulation layer 33 is deposited in the same step in which the lower insulation layer 36a is deposited. Also, the second insulation layer 39 is deposited in the same step in which the upper insulation layer 36b is deposited. Therefore, the first insulation layer 33 and the second insulation layer 39 are formed from the same materials as those of the lower insulation layer 36a and the upper insulation layer 36b, respectively.

Also, as shown in FIG. 1, the first insulation layer 33 and the second insulation layer 39 are formed such that their interface 42 may be generally at the same level of the top surface of the fuses 20. It is noted that, when a layer of high melting point metal nitride 24 is formed on the fuses 20, such as in the case of the semiconductor device in accordance with the present embodiment, the first insulation layer 33 and the second insulation layer 39 are formed such that their interface 42 is located generally at the same level of the top surface of the layer of high melting point metal nitride 24.

To form the interface 42 between the first insulation layer 33 and the second insulation layer 39, at least the first insulation layer 33 and the second insulation layer 39 need to be formed by different film forming processes. In general, the interface 42 is formed when the two layers joined to each other are formed by different film forming processes, without regard to the materials respectively composing these two layers. In other words, only if the first insulation layer 33 and the second insulation layer 39 are formed by different film forming processes, the interface 42 between the first insulation layer 33 and the second insulation layer 39 is formed.

Here, let one consider, as a comparison example, a case in which the interface 42 is not formed between the first insulation layer 33 and the second insulation layer 39. In this case, when the fuses 20 are fused, cracks may be generated in an interface between the second interlayer dielectric layer 34 located below the fuses 20 and the lower insulation layer 36a. In particular, when the second interlayer dielectric layer 34 is made of a material having a greater hardness than that of the lower insulation layer 36a, there is a possibility at the time of fusing the fuses 20 that cracks may be generated in the lower insulation layer 36a that has a lower hardness because of the energy applied to the insulation layer around the fuses 20 by vaporization of the material of the fuses 20. The generation of cracks makes it difficult to conduct a stable fusing in the fuse section, and also may possibly affect internal elements and wirings.

In contrast, by the semiconductor device in accordance with the present embodiment, since the interface 42 is formed to be located generally at the same level of the top surface of the fuses 20, the fuses 20 can be appropriately fused. In other words, incidents, in which the fuses 20 are not fused, or cracks are generated in the insulation layer around the fuses 20 at the time of fusing, can be inhibited or prevented. Reasons for this are described below.

Because the interface 42 is formed generally at the same level of the top surface of the fuses 20, the following becomes possible. When a laser beam is irradiated on the fuse 20, and the material composing the fuse 20 vaporizes, cracks are generated in the insulation layer located above the fuses 20 (the second insulation layer 39 in FIG. 1) along the interface 42 before cracks occur in the interlayer dielectric layer located below the fuses 20 (the second interlayer dielectric layer 34 in FIG. 1), and the second insulation layer 39 can be locally removed at the same time when the material vaporizes. By this, the fuse 20 can be appropriately fused without cracks being generated. As a result, the production yield can be improved.

Also, in order to appropriately fuse the fuses 20, the second insulation layer 39 may preferably have hardness lower than that of the first insulation layer 33. In other words, when the second insulation layer 39 has hardness lower than that of the first insulation layer 33, cracks are generated in the second insulation layer 39 with the lower hardness when the fuse 20 is fused and the material composing the fuse 20 vaporizes. This makes it easier to locally remove the second insulation layer 39 together with the vaporization of the material. As a result, fusing of the fuses 20 more smoothly develops, and therefore the fuses 20 can be more adequately fused.

In the present embodiment, the first insulation layer 33 is made of FSG, and the second insulation layer 39 is made of silicon oxide. In general, a fluorine doped silicon oxide layer has a higher density than that of a normal silicon oxide layer to the extent to which the silicon oxide layer is doped with fluorine, and therefore has greater hardness than that of the normal silicon oxide layer. For this reason, the second insulation layer 39 has hardness lower than that of the first insulation layer 33, and therefore fusing of the fuses 20 more smoothly develops, and therefore the fuses 20 can be more adequately fused.

Also, the third insulation layer 37 covers upper portions of the fuses 20. In the semiconductor device in accordance with the present embodiment, the third insulation layer 37 is formed over the fuses 20 with the layer of high melting point metal nitride 24 being interposed between them. The third insulation layer 37 is deposited in the same step in which the lower insulation layer 36a is deposited. In other words, the third insulation layer 37 is formed in the same step in which the first insulation layer 33 is formed. The third insulation layer 37 can be removed depending on the requirements. For example, before the upper insulation layer 36b is deposited, the lower insulation layer 36a formed above the layer of high melting point metal nitride 24 may be removed. As a result, the second insulation layer 39 can be formed instead of the third insulation layer 37 being formed on the layer of high melting point metal nitride 24.

The film thickness of an insulation layer formed on the fuses 20 may preferably between 0.2 $\mu$m and 1 $\mu$m. When the layer of high melting point metal nitride 24 is formed on the fuses 20, and the third insulation layer 37 is formed on the layer of high melting point metal nitride 24, such as in the case of the semiconductor device in accordance with the present invention, the third insulation layer 37 may preferably have a film thickness between 0.2 $\mu$m and 1 $\mu$m.

When the film thickness of the insulation layer that is formed on the fuses 20 is less than 0.2 $\mu$m, there is a possibility in that water may penetrate into the semiconductor device through the fuses 20. On the other hand, when the film thickness of the insulation layer that is formed on the fuses 20 exceeds 1 $\mu$m, the following problem may occur. When a laser beam with a wavelength of 1.3 $\mu$m is used to fuse the fuse 20 that is made of aluminum, the power of the laser beam may have to be intensified to reach the laser beam onto the fuse 20, or the fuse 20 cannot be fused unless the time for irradiation of the laser beam is extended. When the time for the laser beam irradiation is extended, a problem occurs in that the throughput lowers. Also, the intensified laser beam may affect adjacent fuses. Because of the problems described above, there are cases where the fuses 20 are difficult to be appropriately fused. In contrast, when the film thickness of the insulation layer formed on the fuses 20 is between 0.2 $\mu$m and 1 $\mu$m, the fuses 20 can be appropriately fused by irradiation of the laser beam without harming the reliability of the semiconductor device. Accordingly, in the semiconductor device of the present embodiment, when the third insulation layer 37 that is formed on the layer of high melting point metal nitride 24 is 0.2 $\mu$m to 1 $\mu$m, the effects described above can be achieved. As a result, the production yield of the semiconductor devices is further improved.

In the semiconductor device shown in FIG. 1, the fuses 20 are formed in a layer at the same level of the wiring layer 50 that is formed in the circuit section 120. The wiring layer 50 and the fuses 20 can be formed by the same patterning process. Therefore, in this case, the wiring layer 50 and the fuses 20 are both formed on the second interlayer dielectric layer 34, have generally the same film thickness, and are formed from the same material. For example, the wiring layer 50 and the fuses 20 can be formed from conductive material, such as, for example, aluminum, copper, polysilicon, tungsten or titanium.

In description of the semiconductor device in accordance with the present embodiment, one case is presented in which the fuses 20 are formed in a layer at the same level as that of a wiring layer (the wiring layer 50 in FIG. 1) below the uppermost wiring layer 60 among the wiring layers composing the circuit section 120. However, the position where the fuses 20 may be formed is not limited to this layer, but they may be formed in a layer at the same level of another one of the wiring layers. When the fuses 20 are formed in a layer at a level below the uppermost wiring layer 60, wirings that might otherwise be required to raise the fuses 20 to the uppermost wiring layer become unnecessary, which improves the degree of freedom in the circuit design. In particular, when a pad section to be used for external connection is formed at the same level as that of the uppermost wiring layer, a process for removing the insulation layer on the pad section, which is conducted to form electrodes for external connection on the pad section, and a process for removing the insulation layer on the fuses, which is conducted to form an opening section for forming the fuses, can be simultaneously controlled, and therefore the manufacturing process can be made more efficient.

Also, in the semiconductor device shown in FIG. 1, layers of high melting point metal nitride 22 and 24 are formed on bottom surfaces and top surfaces of the fuses 20, respectively. Each of the layers of high melting point metal nitride 22 and 24 is formed from a layer of high melting point metal nitride or a stacked layer of layers of high melting point metal nitride and high melting point metal.

For example, a titanium nitride layer or a stacked layer of titanium and titanium nitride layers are examples of the layers of high melting point metal nitride 22 and 24. Similarly, layers of high melting point metal nitride 52 and 54 are formed respectively on a bottom surface and a top surface of the wiring layer 50 that comprises the circuit section 120. The layers of high melting point metal nitride 52 and 54 can also be formed by the same process in which the layers of high melting point metal nitride 22 and 24 are formed on the bottom surface and the top surface of the fuses 20.

The layers of high melting point metal nitride 52 and 54 act to improve the reliability (such as stress migration resistance and electromigration resistance) of the wiring layer 50. Furthermore, the nitride layer 54 may be used as a reflection preventing film in a photolithography process to process the wiring layer 50.

Figure 3:
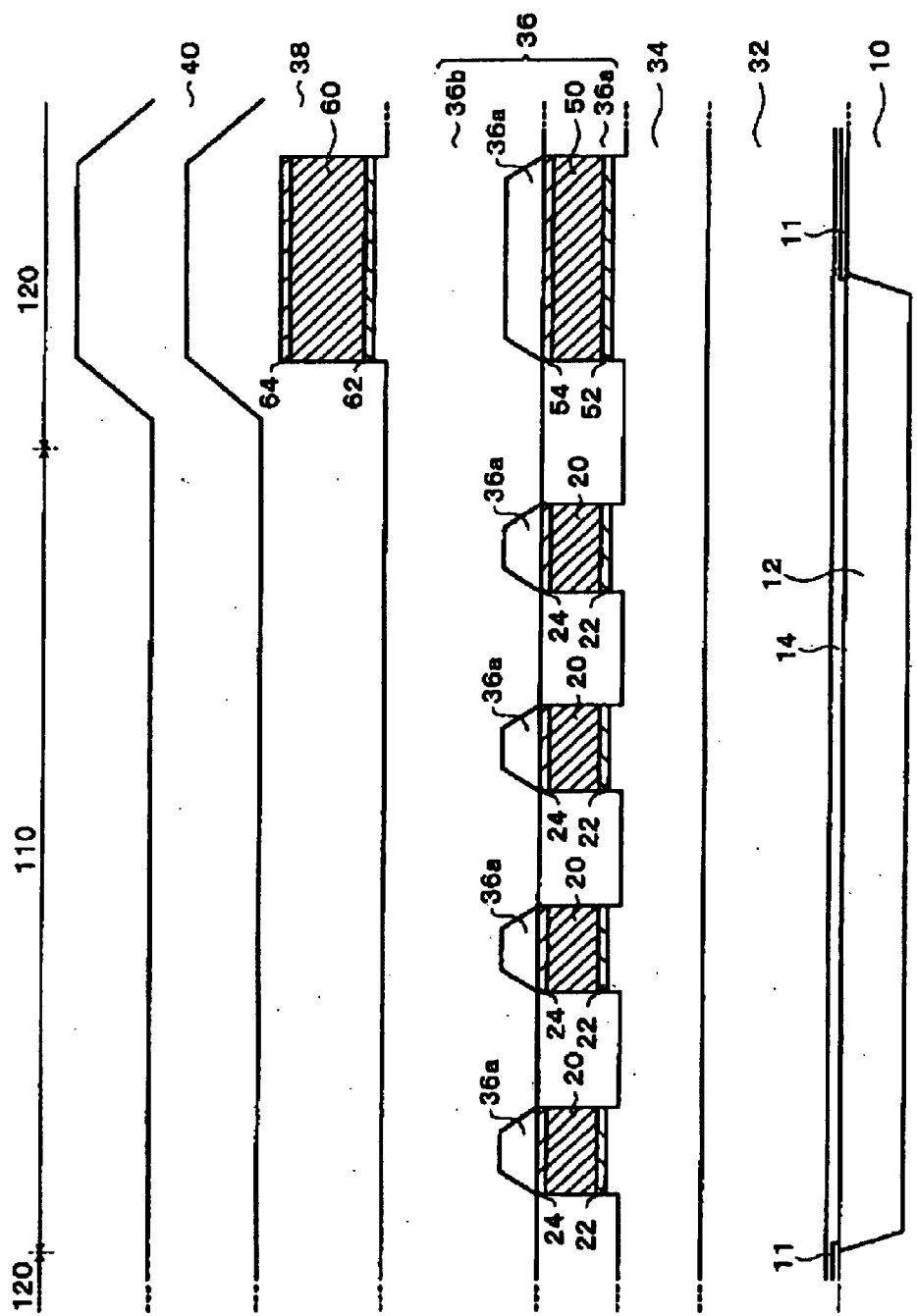
FIG. 3 schematically shows in cross section a step for manufacturing the semiconductor device shown in FIG. 1.

Next, one example of a method for manufacturing the semiconductor device in accordance with the present embodiment shown in FIG. 1 will be described with reference to FIG. 1 and FIG. 3. FIG. 3 schematically shows in cross section a step for manufacturing the semiconductor device shown in FIG. 1.

(1) First, after an element isolation region 12 is formed in a silicon substrate 10, a resist in a specified pattern is formed on the substrate, and then wells are formed at specified locations by an ion implantation. Then, transistors are formed on the silicon substrate 10, and thereafter a silicide layer 11 including high melting point metal such as titanium or cobalt is formed by a known salicide technique. Then, a stopper layer 14 composed of silicon nitride as a main component is formed by a plasma CVD method or the like.

Next, fuses 20 in a fuse section 110 and wiring layers including wiring layers 50 and 60 (only wiring layers 50 and 60 are shown in the figure) in a circuit section 120 are formed, and first-fourth interlayer dielectric layers 32, 34, 36 and 38 are successively deposited in layers. The first-fourth interlayer dielectric layers 32, 34, 36 and 38 may be formed, for example, by an HDP method, an ozone TEOS (tetraethylorthosilicate) method, or a plasma CVD method, and may be planarized if necessary.

(2) Next, the fuses 20 and the wiring layer 50 are formed together on the second interlayer dielectric layer. A process for forming the fuses 20 and the wiring layer 50 will be described below.

First, after the first and second interlayer dielectric layers 32 and 34 are formed, a layer of high melting point metal nitride such as titanium nitride, a metal layer of aluminum having a specified film thickness, and a stacked layer of a layer of high melting point metal such as titanium and a layer of high melting point metal nitride such as titanium nitride are formed by a sputtering method, and then these layers are patterned in specified shapes. Through these steps, the layers of high melting point metal nitride 22 and 52 are formed from the layer of high melting point metal nitride, the fuses 22 and the wiring layer 50 are formed from the metal layer of aluminum, and the layers of high melting point metal nitride 24 and 54 are formed from the stacked layer of a layer of high melting point metal nitride and a layer of high melting point metal. In the patterning step, the fuses 20, each having a specified film thickness and width, are formed at a specified pitch, and the wiring layer 50 is also formed in the same film thickness as that of the fuses 20.

(3) Next, a process for depositing the third interlayer dielectric layer 36 will be described.

First, a lower insulation layer 36a comprising FSG is deposited on the second interlayer dielectric layer 34, the layer of high melting point metal nitride 24 composing the fuses 20, and the wiring layer 50. In this step, the lower insulation layer 36a is deposited on the second interlayer dielectric layer 34 and the layer of high melting point metal nitride 24, as shown in FIG. 3. Here, the film thickness is set such that the top surface of the lower insulation layer 36a is generally at the same level as that of the top surface of the fuses 20 (the top surface of the layer of high melting point metal nitride 24 in FIG. 1).

A first insulation layer 37 is formed from the lower insulation layer 36a deposited on the layer of high melting point metal nitride 24 by a process described below.

Next, an upper insulation layer 36b comprising silicon oxide is deposited on the lower insulation layer 36a. By the following steps, the third interlayer dielectric layer 36 composed of the lower insulation layer 36a and the upper insulation layer 36b is formed.

(4) Next, the wiring layer 60 is formed on the third interlayer dielectric layer 36.

The wiring layer 60 is formed through sputtering and patterning steps just as the wiring layer 50 is formed. As a result, the wiring layer 60 having a specified film thickness with layers of high melting point metal nitride 62 and 64 formed on its bottom and top surfaces is formed on the third interlayer dielectric layer 36.

Contact sections for electrically connecting the wiring layers may be formed in each of the interlayer dielectric layers. The contact section is formed through forming a contact hole that passes through each of the interlayer dielectric layers, and a conductive material is embedded in the contact hole by, for example, a sputtering method.

Further, after the fourth interlayer dielectric layer 38 is formed, a passivation layer 40 formed from silicon nitride layer or the like is formed on the fourth interlayer dielectric layer 38.

Figure 4:
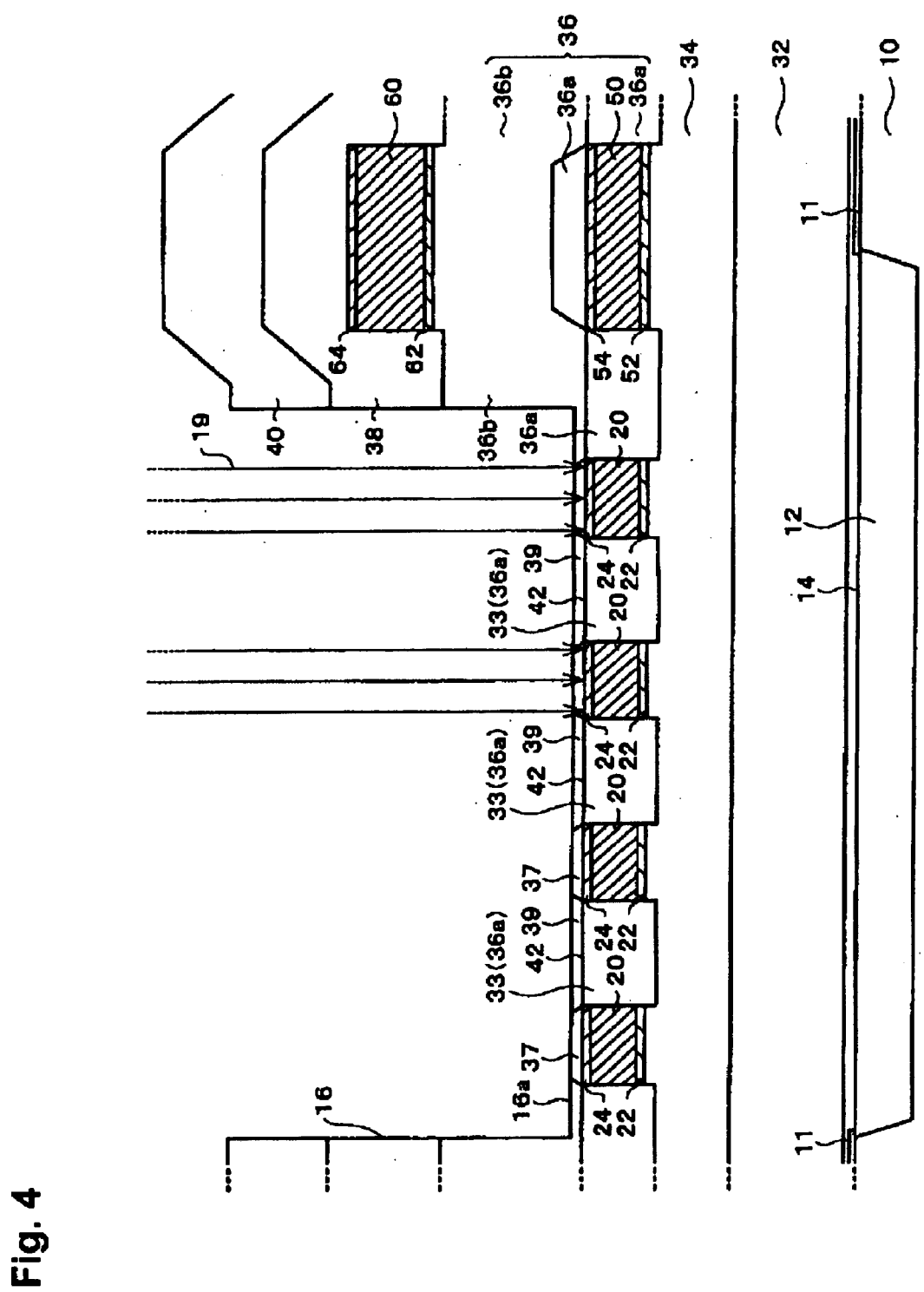
FIG. 4 schematically shows in cross section a step of fusing the fuses conducted on the semiconductor device shown in FIG. 1.

(5) Next, a specified region of the semiconductor device is etched from the side of the passivation layer 40 to an intermediate position in the upper insulation layer 36b, to thereby form an opening section 16, as shown in FIG. 1. In this step, the opening section 16 is formed such that the fuses 20 are located in a bottom section 16a of the opening section 16. Also, in order to prevent corrosion of the fuses 20, the upper insulation layer 36b is etched such that upper portions of the fuses 20 are covered by the insulation layer having a specified film thickness, as shown in FIG. 4. In this step, the upper insulation layer 36b formed over the layer of high melting point metal nitride 24 is etched to a specified film thickness, and the third insulation layer 37 is formed on the layer of high melting point metal nitride 24. Also, the first insulation layer 33 is formed embedded between adjacent ones of the fuses 20. Further, a second insulation layer 39 is formed on the first insulation layer 33. The first insulation layer 33 and the second insulation layer 39 are formed from the lower insulation layer 36a and the upper insulation layer 36b, respectively. The interface 42 between the first insulation layer 33 and the second insulation layer 39 is formed generally at the same level of the top surface of the fuses 20 (the top surface of the layer of high melting point metal nitride 24 in FIG. 1).

Figure 5:
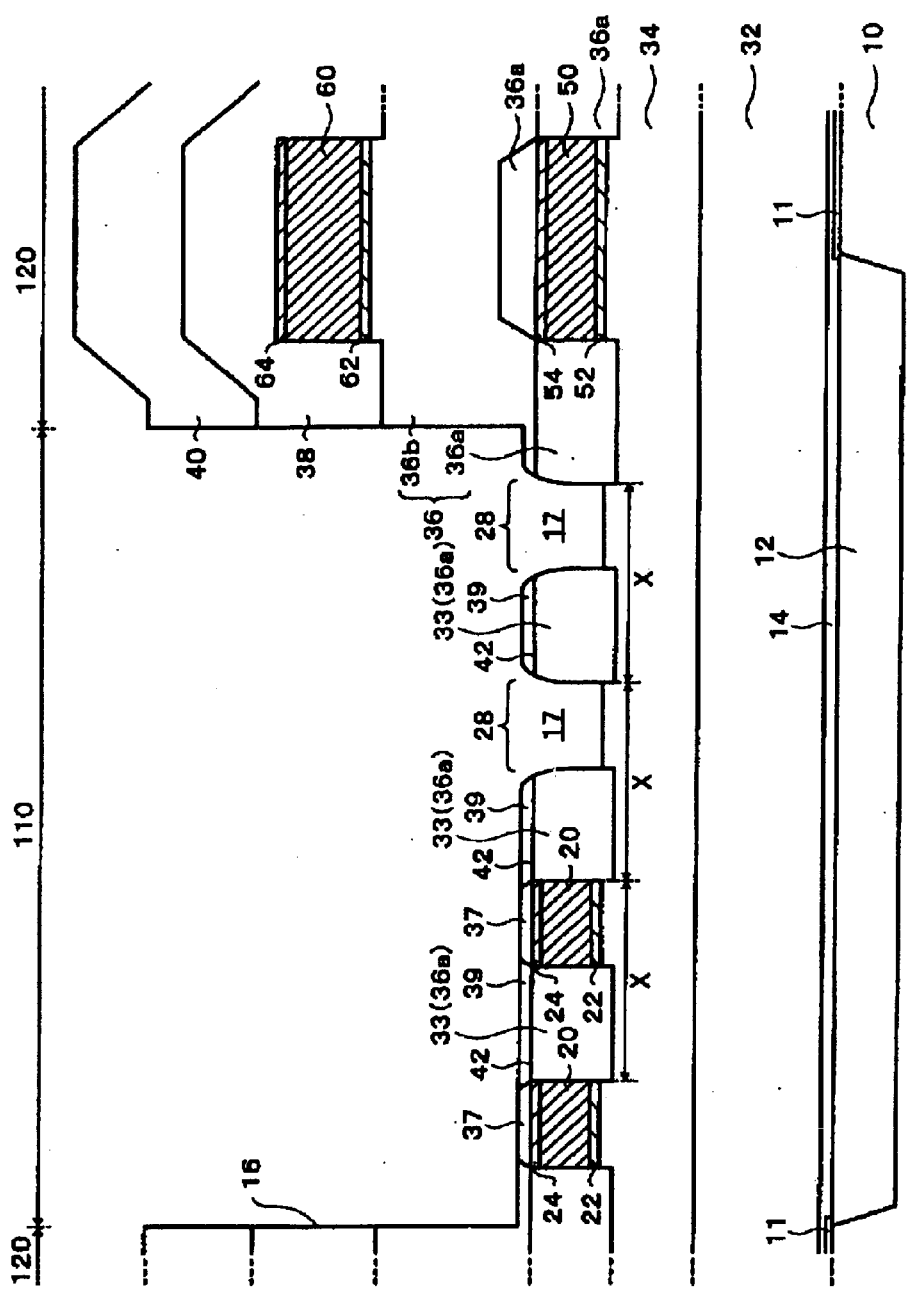
FIG. 5 schematically shows a cross section of fuses that are fused in the step shown in FIG. 4.

Next, one example of a process for fusing the fuses 20 formed in the semiconductor device shown in FIG. 1 will be described with reference to FIGS. 4 and 5. FIG. 4 schematically shows in cross section a step of fusing the fuses 20. FIG. 5 schematically shows a cross section of fuses 28 that are fused.

As shown in FIG. 4, in order to use a redundant memory cell, a laser beam 19 from a laser beam source is irradiated onto each of the corresponding fuses 20. As a result, those of the fuses 20 irradiated by the laser beam 19 are blown. Appropriate wavelength and power of the laser beam may be determined in view of the material and film thickness of the fuses 20, the layer of high melting point metal nitride 24 formed on the top surfaces of the fuses 20, and the third insulation layer 37 formed on the layer of high melting point metal nitride 24.

FIG. 5 schematically shows the fuses 28 that are fused by the step indicated in FIG. 4. When the fuses 20 shown in FIG. 4 are fused, the layers of high melting point metal nitride 22 and 24 and the insulation layer (the third insulation layer 37 and a part of the second insulation layer 39) formed on the fuses 20 are locally removed together with the fuses 20, and grooves 17 are formed in the fuse section 110, as shown in FIG. 5.

In the semiconductor device of the present embodiment, the first insulation layer 33 and the second insulation layer 39 are formed such that the interface 42 between the first insulation layer 33 and the second insulation layer 39 is generally at the same level as the top surface of the fuses 20. Accordingly, for the reasons described above, the fuses 20 can be appropriately fused. As a result, the production yield can be increased. Furthermore, in the semiconductor device of the present embodiment, the second insulation layer 39 has harness lower than that of the insulation layer 33. Accordingly, for the reasons described above, fusing of the fuses 20 advances more smoothly, and thus the fuses 20 can be more appropriately fused.

It is noted that the present invention is not limited to the embodiments described above, and many changes can be made within the scope of the present invention.

What is claimed:

1. A semiconductor device comprising:
a plurality of fuses arranged at a specified pitch wherein the fuses are adapted to be fused by irradiation of a laser beam;
a first insulation layer embedded between adjacent ones of the fuses; and
a second insulation layer formed on the first insulation layer,
wherein a top surface of the fuses and an interface between the first insulation layer and the second insulation layer are generally at an identical level, and
wherein the second insulation layer has a hardness less than that of the first insulation layer.

2. A semiconductor device comprising:
a plurality of fuses arranged at a specified pitch wherein the fuses are adapted to be fused by irradiation of a laser beam;
a first insulation layer embedded between adjacent ones of the fuses; and
a second insulation layer formed on the first insulation layer,
wherein a top surface of the fuses and an interface between the first insulation layer and the second insulation layer are generally at an identical level, and
wherein the first insulation layer is formed from FSG, and the second insulation layer is formed from silicon oxide.

3. A semiconductor device comprising:
a plurality of fuses spaced apart from one another, the fuses including an upper layer thereon;
a first insulation layer located between adjacent fuses; and
a second insulation layer formed on the first insulation layer,
wherein a top surface of the upper layer on the fuses and an interface between the first insulation layer and the second insulation layer are at an identical level, and
wherein the first insulation layer and the second insulation layer have different compositions.

4. A semiconductor device comprising:
a plurality of fuses spaced apart from one another, the fuses including an upper layer thereon;
a first insulation layer located between adjacent fuses; and
a second insulation layer formed on the first insulation layer,
wherein a top surface of the upper layer on the fuses and an interface between the first insulation layer and the second insulation layer are at an identical level, and
wherein the second insulation layer has a hardness less than that of the first insulation layer.

5. A semiconductor device comprising:
a plurality of fuses spaced apart from one another, the fuses including an upper layer thereon;
a first insulation layer located between adjacent fuses; and
a second insulation layer fanned on the first insulation layer,
wherein a top surface of the upper layer on the fuses and an interface between the first insulation layer and the second insulation layer are at an identical level, and
wherein the first insulation layer is formed from FSG, and the second insulation layer is formed from silicon oxide.

6. A semiconductor device as comprising:
a plurality of fuses, wherein the fuses are adapted to be fused by irradiation of a laser beam;
a first insulation layer disposed between adjacent ones of the fuses;
a second insulation layer formed on the first insulation layer, and
a dielectric layer disposed under the fuses,
wherein an interface between the first insulation layer and the second insulation layer is positioned so that when at least one of the fuses is being fused by irradiation of the laser beam, cracks are formed at a level above that of the at least one of the fuses prior to any cracks being formed in the dielectric layer below the at least one of the fuses, and
wherein a third insulation layer is formed on an upper surface of the at least one of the fuses, and wherein the interface between the first insulation layer and the second insulation layer is positioned so that when at least one of the fuses is being fused by irradiation of the laser beam, cracks are formed in the second insulation layer and in the third insulation layer at a level above that of the at least one of the fuses prior to any cracks being formed in the dielectric layer below the at least one of the fuses.

7. A semiconductor device according to claim 1, wherein a third insulation layer is formed above the fuses.

8. A semiconductor device according to claim 7, wherein the third insulation layer is formed by a common process that forms the first insulation layer.

9. A semiconductor device according to claim 7, wherein the third insulation layer has a film thickness between 0.2 µm and 1 µm.

10. A semiconductor device according to claim 1, wherein the fuses are formed at a bottom section of an opening section formed on a semiconductor substrate.

11. A semiconductor device according to claim 1, further comprising a circuit section having a structure of multiple wiring layers, and the fuses are formed in a layer at a level identical with that of one of the wiring layers of the circuit section.

12. A semiconductor device according to claim 11, wherein the fuses are formed in a layer at a level identical with that of one of the wiring layers below an uppermost wiring layer among the wiring layers of the circuit section.

13. A semiconductor device according to claim 11, wherein a film thickness of the fuses is generally equal to a film thickness of one of the wiring layers of the circuit section.

14. A semiconductor device according to claim 1, wherein the second insulation layer is positioned above the first insulation layer and the third insulation layer is positioned in direct contact with the second insulation layer.

15. A semiconductor device according to claim 2, wherein a third insulation layer is positioned above the fuses.

16. A semiconductor device according to claim 2, wherein the second insulation layer is positioned above the first insulation layer and the third insulation layer is positioned in direct contact with the second insulation layer.

17. A semiconductor device according to claim 3, wherein a third insulation layer is formed above the fuses.

18. A semiconductor device according to claim 17, wherein the third insulation layer and the first insulation layer have an identical composition.

19. A semiconductor device according to any one of claim 3, further comprising a circuit section having a structure of multiple wiring layers, and the fuses are formed in a layer at a level identical with that of one of the wiring layers below an uppermost wiring layer among the wiring layers of the circuit section.

20. A semiconductor device according to claim 4, wherein a third insulation layer is formed above the fuses.

21. A semiconductor device according to claim 4, wherein the second insulation layer is positioned above the first insulation layer.

22. A semiconductor device according to claim 5, wherein a third insulation layer is formed above the fuses.

23. A semiconductor device according to any one of claim 22, further comprising a circuit section having a structure of multiple wiring layers, and the fuses are formed in a layer at a level identical with that of one of the wiring layers below an uppermost wiring layer among the wiring layers of the circuit section.

24. A semiconductor device according to claim 22, wherein the second insulation layer is positioned above the first insulation layer and the third insulation layer is positioned in direct contact with the second insulation layer.

* * * * *